United States Patent [19]
Wolak et al.

[11] Patent Number: 6,044,096
[45] Date of Patent: Mar. 28, 2000

[54] PACKAGED LASER DIODE ARRAY SYSTEM AND METHOD WITH REDUCED ASYMMETRY

[75] Inventors: Edmund L. Wolak, Palo Alto; John G. Endriz, Belmont, both of Calif.

[73] Assignee: SDL, Inc., San Jose, Calif.

[21] Appl. No.: 08/962,768

[22] Filed: Nov. 3, 1997

[51] Int. Cl.[7] .................................................. H01S 3/043
[52] U.S. Cl. ................... 372/36; 372/34; 372/109
[58] Field of Search .............................. 372/101, 43, 108, 372/36, 34, 109; 428/196; 356/153

[56] References Cited

U.S. PATENT DOCUMENTS

| | | | |
|---|---|---|---|
| 4,061,814 | 12/1977 | Politycki | 428/196 |
| 4,738,532 | 4/1988 | Robertson | 356/153 |
| 5,168,401 | 12/1992 | Endriz | 359/625 |
| 5,243,619 | 9/1993 | Albers et al. | 372/625 |
| 5,369,661 | 11/1994 | Yamaguchi et al. | 372/69 |
| 5,418,880 | 5/1995 | Lewis et al. | 385/123 |
| 5,515,391 | 5/1996 | Endriz | 372/34 |
| 5,517,328 | 5/1996 | Wilson | 358/471 |
| 5,544,184 | 8/1996 | Wolak et al. | 372/43 |

FOREIGN PATENT DOCUMENTS 601 485 A2  6/1994  European Pat. Off. .
WO 95/15510  6/1995  WIPO .

OTHER PUBLICATIONS

Yamaguchi et al. entitled "Collimation of emissions form a high–power multistripe laser–diode bar with multiprism array coupling and focusing to a small spot" Optical Society of America, vol. 20, No. 8, Apr. 15, 1995.

*Primary Examiner*—James W. Davie
*Attorney, Agent, or Firm*—W. Douglas Carothers, Jr.

[57] ABSTRACT

A system and method for operating a high power laser diode device with high efficiency coupling of a laser diode bar. The laser diode bar and a micro-cylinder lens are vertically oriented in a device package, such that the array axis of the laser bar and the longitudinal axis of the micro-cylinder lens are aligned substantially parallel to a gravity vector. In the two different embodiments disclosed, either initial collimation of the fast-axis divergence or, alternatively, initial collimation of both the fast-axis and slow-axis divergences take place before beam reformatting via a beam array turning mirror. Additionally, the vertical orientation of these components is combined with methods of compensating for the bending or "smile" of the laser diode bar to provide for optimal output beam coupling, resulting in a uniform far field intensity distribution.

20 Claims, 4 Drawing Sheets

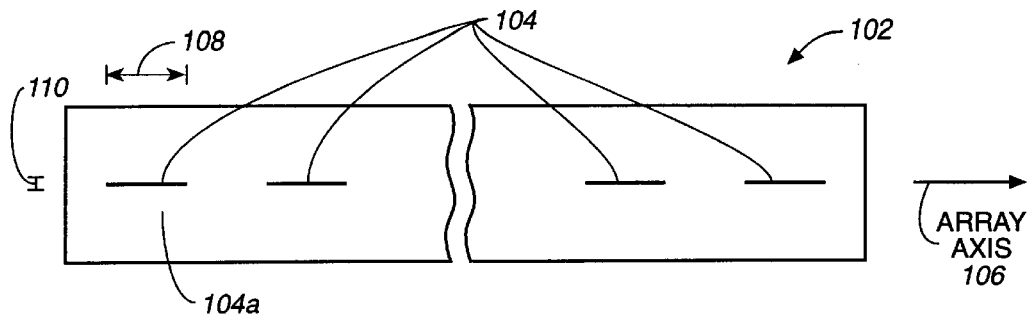
FIG._1
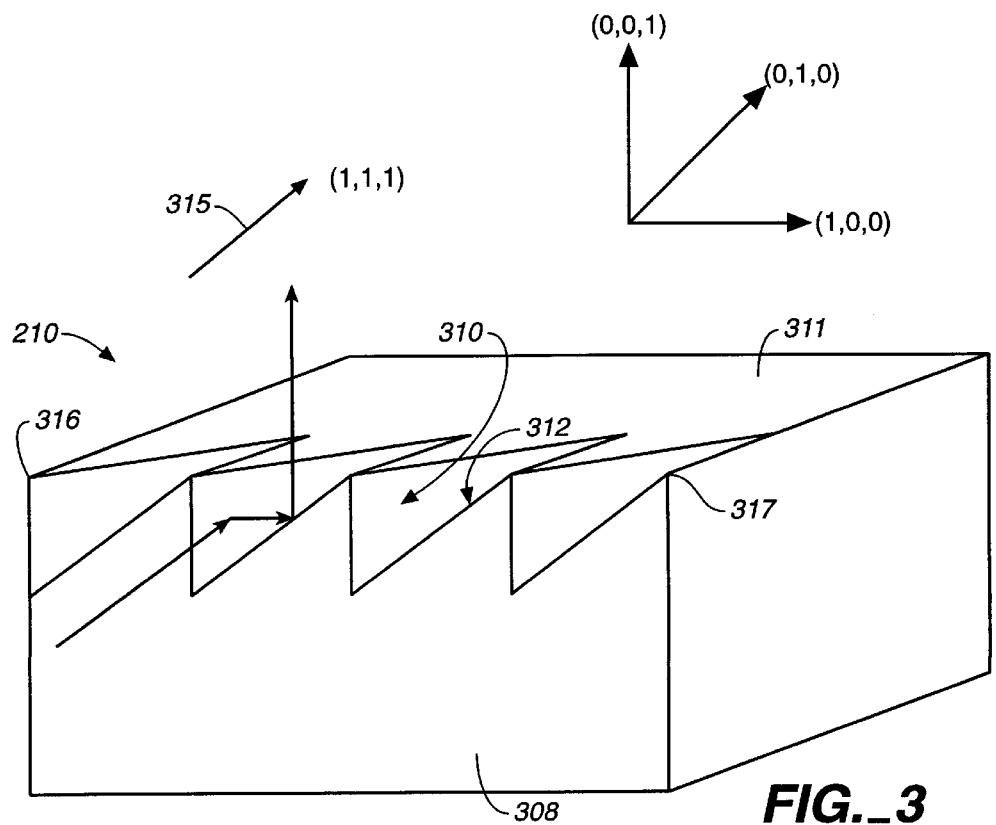
FIG._3

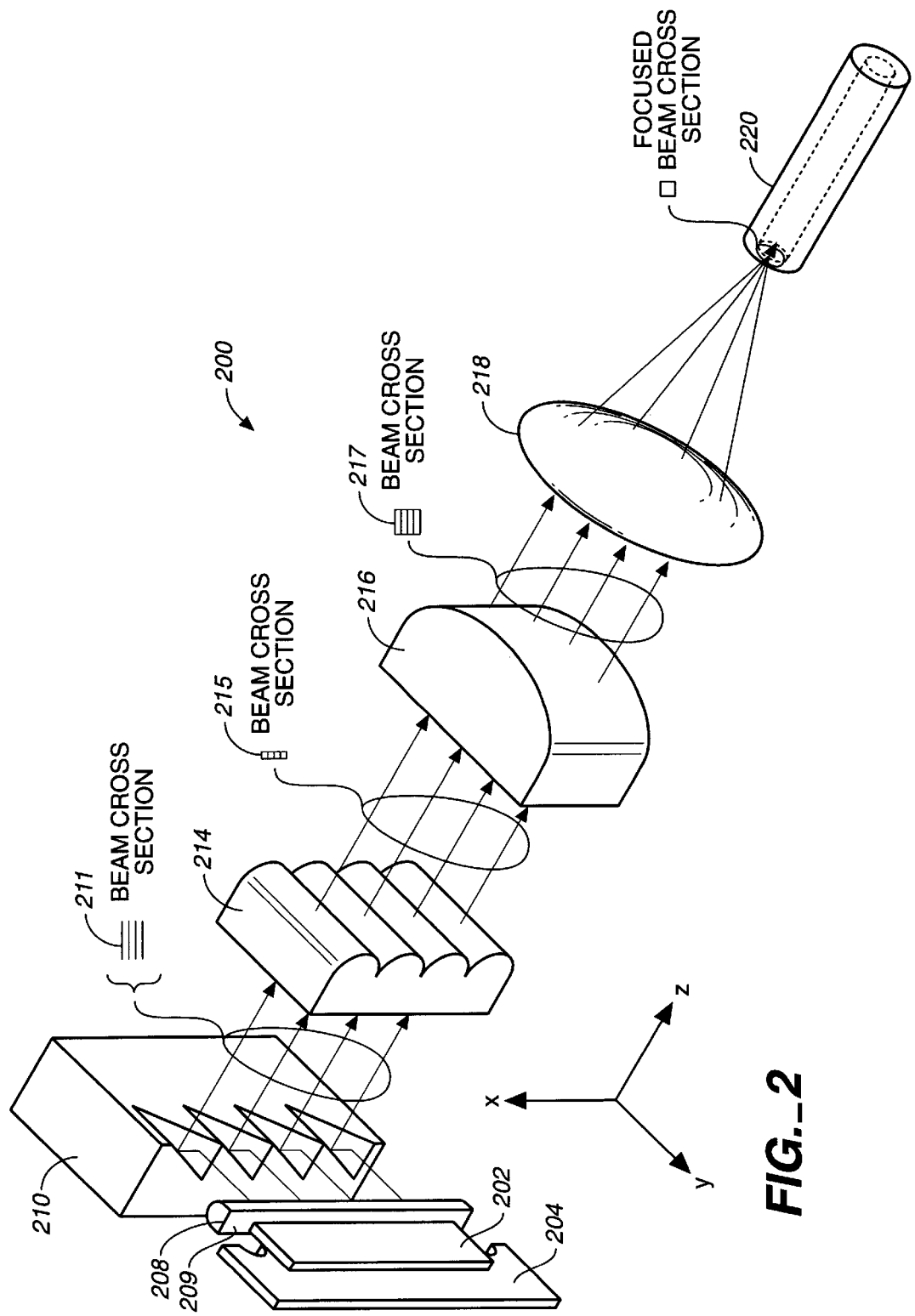
FIG._2

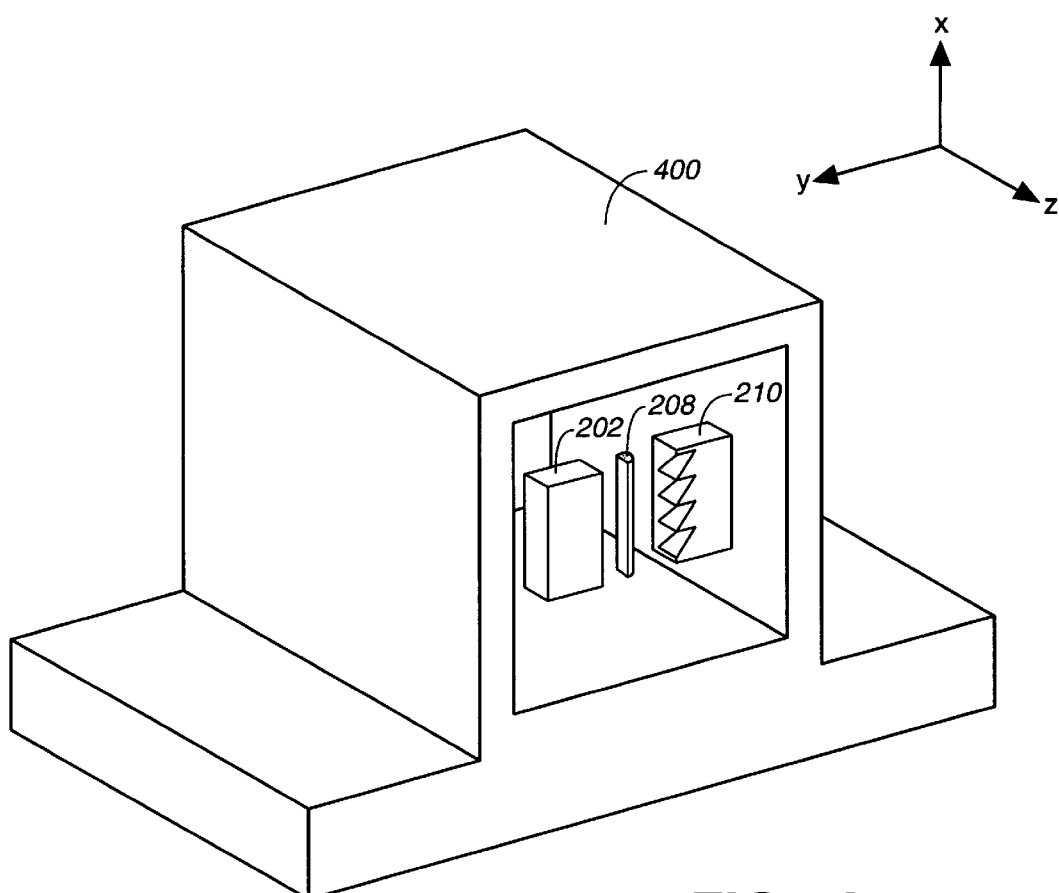
FIG._4

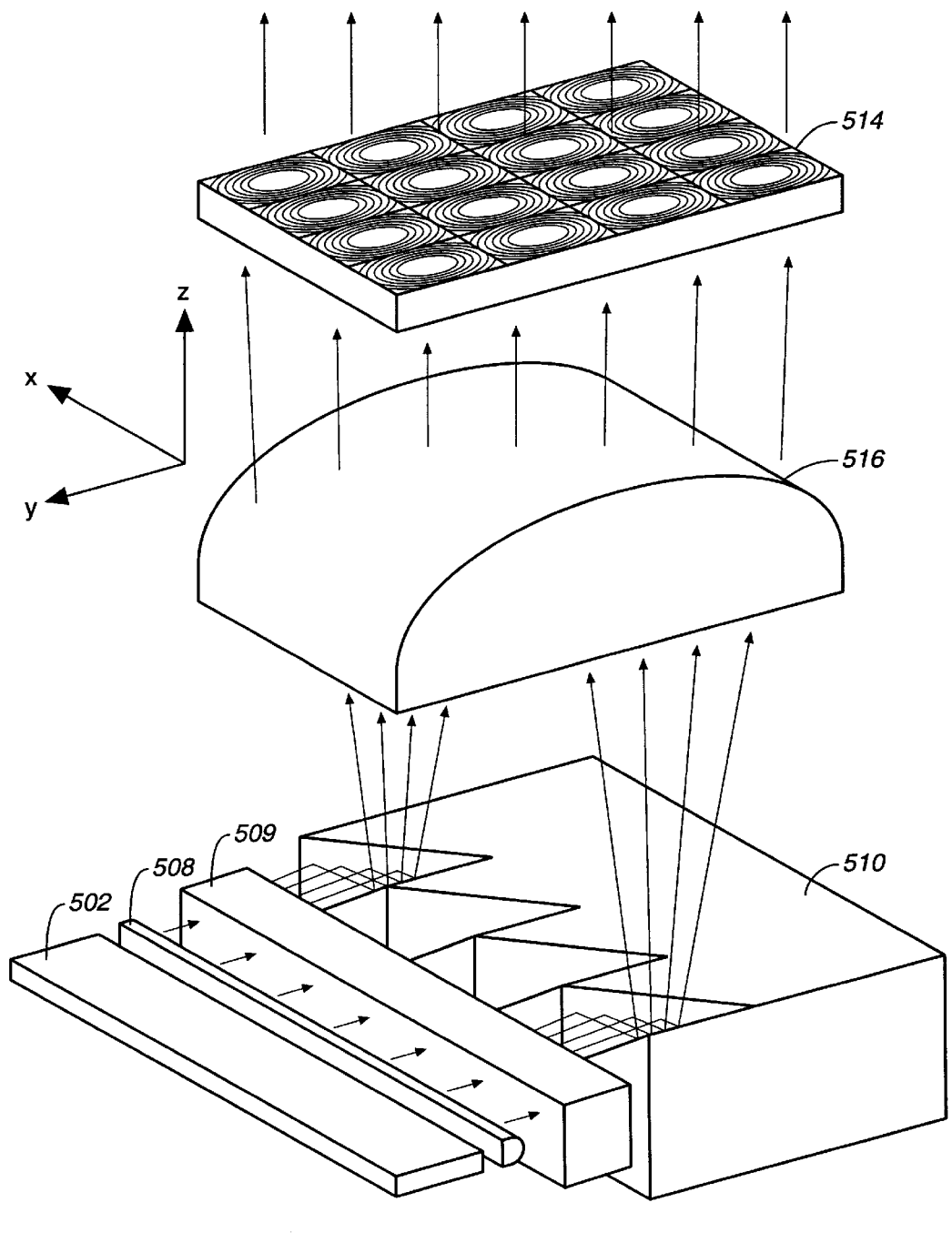
FIG._5

PACKAGED LASER DIODE ARRAY SYSTEM AND METHOD WITH REDUCED ASYMMETRY

FEDERALLY SPONSORED RESEARCH AND DEVELOPMENT

This invention was made with U.S. Government support under Contract No. QM3974 awarded by the Defense Advance Research Projects Agency. The U.S. Government has certain rights in the invention.

BACKGROUND OF THE INVENTION

1. Field of the Invention

This invention relates generally to semiconductor devices and more specifically to a high power semiconductor laser diode package that provides efficient collimation of a laser diode bar to conserve source brightness for far-field applications.

2. Related Art

High-power laser diode bar packages are commonplace on the laser market. Diode bars consisting of 10–100 individual light-emitting sources produce output power in the tens of watts under continuous-wave operation. Yet a difficulty still remains in effectively collecting and collimating the light emitted from these high power laser diode arrays. A major contribution to this difficulty is the inherent asymmetry of the laser diode output beam.

An exemplary laser diode bar is shown schematically in FIG. 1. Laser diode bar 102 may include approximately 20–30 individual light-emitting sources 104 arranged along array axis 106. A typical light-emitting source, such as source 104a, has a lateral dimension 108 (along array axis 106), which can range from approximately 20 to 500 micrometers ($\mu$m). In the transverse direction (perpendicular to the array axis 106), however, the light-emitting source has a transverse dimension 110 of approximately 1 to 2 $\mu$m. The divergence in the lateral direction, also referred to as the slow-axis divergence, is characterized by a lateral divergence angle in the range of approximately 8° to 20°. The divergence in the transverse direction, also referred to as the fast-axis divergence, is much stronger, with a typical transverse divergence angle ranging from approximately 20° to 100°. In order to provide a laser source with a greater range of uses, optical systems comprising lenses, spherical optics, mirrors, and waveguides have been proposed to reduce the inherent asymmetry of the output beam profile. Preferably, these optical systems can reduce the inherent asymmetry, while still conserving individual source brightness. See, e.g., U.S. Pat. No. 5,168,401, issued Dec. 1, 1992 to Endriz (incorporated by reference herein in its entirety).

However, other considerations such as laser package size and/or thermal management of these high-power devices can present a laser designer with a tradeoff that results in less-than-optimal optical output beam divergences. Thus, what is needed is a high power laser diode package that provides for optimal coupling of the laser diode output beam.

SUMMARY OF THE INVENTION

The present invention provides a laser diode device and a method for reducing the asymmetry of the output beam. According to the present invention, a laser diode bar comprising a plurality of individual laser diode sources is oriented in a vertical manner, where the longitudinal length (or array axis) of the laser diode bar is aligned along a direction substantially parallel to a gravity vector. The output of each individual diode source exhibits two distinct divergences, a fast-axis divergence corresponding to the laser light emerging from the narrow (transverse) region of the diode (i.e., perpendicular to the array axis) and a slow-axis divergence corresponding to the laser light emerging from the long (lateral) region of the diode (i.e., parallel to the array axis).

A lens system, such as a micro-cylinder lens, is used to collect the output of the laser and to collimate the fast-axis divergence of the diode laser output. The lens system is also oriented in a vertical manner (i.e., transverse or orthogonal to array axis 106 in FIG. 1), where the longitudinal axis of the lens system is aligned along a direction parallel to a gravity vector. In this vertical orientation, bending or deforming of the lens system due to gravity or other forces, such as due to package mounting, is prevented and the coupling of the output beam of the laser diode bar is optimized.

According to a second embodiment of the present invention, the inherent bending or "smile" of the diode laser bar is reduced. The laser diode bar further includes a plurality of thermal load elements corresponding to the number of individual laser diode sources. By applying a direct current (d.c.) bias current to the thermal load elements, the temperature increase or decrease causes a shift in the position of an individual laser diode source with respect to the array axis. This shift in position compensates for any minor displacement due to laser diode bar "smile". Because the laser diode bar axis and longitudinal axis of the lens system are in parallel, particularly as aligned with use of the first embodiment orientation, optimal coupling of the output of the laser diode bar is achieved.

Further features and advantages of the present invention, as well as the structure and operation of various embodiments of the present invention, are described in detail below with reference to the accompanying drawings.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention. In the drawings, like reference numbers indicate identical or functionally similar elements. Additionally, the left-most digit(s) of a reference number identifies the drawing in which the reference number first appears.

FIG. 1 is a front view schematic diagram of a typical laser diode bar;

FIG. 2 is an exploded-view schematic diagram of the diode laser package elements according to the present invention;

FIG. 3 is a schematic diagram of the turning mirror assembly according to the present invention;

FIG. 4 is a schematic diagram of the laser package housing according to the present invention; and FIG. 5 is an exploded view schematic diagram of an alternative embodiment of the present invention.

DETAILED DESCRIPTION OF THE PREFERRED EMBODIMENTS

1. Overview and Discussion of the Invention

The present invention is directed toward a high power laser diode bar package that collimates the output of the laser diode bar by orienting both the laser diode bar and a light output coupling micro-cylinder lens in a vertical manner. It is usually directed that final light outputs is in the Z-direction (see FIG. 2). The longitudinal axis of the micro-controller lens is aligned in a direction substantially parallel to a gravity vector. This implementation avoids a bending of the micro-cylinder lens due to gravitational effects.

2. Vertically Oriented Laser Diode Bar Package

FIG. 2 is a schematic diagram of the high power laser diode package 200 according to the present invention. Package 200 includes a high-power laser diode bar 202, similar to that described above with respect to FIG. 1. In this embodiment of the present invention, diode 202 includes 24 individual light-emitting sources. For convenience of explanation, only a bar with four emitters is illustrated in FIG. 2. Each individual light-emitting source has a light-emitting face positioned at an interval spacing of approximately 400 $\mu$m between each adjacent laser diode. The laser diode emission has the characteristic shape of an elongated, narrow rectangle, with dimensions, e.g., of 1 $\mu$m by 100 $\mu$m. Each diode emitter is oriented with its long dimension parallel to the laser bar (or array) axis, and parallel to the X-axis of FIG. 2. As described above, the divergence of the laser light along the laser bar (long) axis is referred to as the slow-axis, because the divergence of the diode light along this plane is typically small. The slow-axis divergence takes place in the X-Y plane of FIG. 2. The divergence of the laser light emerging from the narrow region of the diode (i.e., perpendicular to the laser bar axis) is referred to as the fast-axis because the emitted radiation diverges at a very high rate. The fast-axis divergence from diode bar 202 takes place in the Y-Z plane of FIG. 2.

Diode bar 202 is mounted on submount 204 that is substantially rectangular in shape. The front surface of diode bar 202 is aligned above the front side of submount 204 so that both front surfaces form a contiguous plane. Additionally, submount 204 can be mounted on a heat spreader (not shown). A heat spreader removes heat generated by diode bar 202. Further, a heat spreader can be a material having a low thermal expansion coefficient, which helps reduce misalignment of the laser diode output.

Laser package 200 also includes a lens system, such as micro-cylinder lens 208, that is vertically mounted onto submount 204, such that its cylindrical (longitudinal) axis is parallel to the X-axis of FIG. 2. In this embodiment, micro-cylindrical lens 208 may be, for example, approximately 63 $\mu$m in diameter. Micro-cylindrical lens 208 reduces the divergence of the fast-axis of the diode laser emission by substantially collimating the beam in a direction perpendicular to the plane of the active region of laser diode bar 202. Micro-cylinder lens 208 is physically mounted to submount 204 such that alignment can be maintained notwithstanding thermal cycling. This mounting is not depicted here, but is described in detail in U.S. Pat. No. 5,544,184, issued Aug. 6, 1996 to Wolak et al. (incorporated by reference in its entirety herein).

Micro-cylinder lens 208 can be a shaped micro-lens, depending upon the output characteristics of laser bar 202. For example, micro-cylinder lens 208 can be flat, circular, periodic, hyperbolic, aspheric, spherical, elliptical, or toroidal, as understood in the art. A shaped micro-lens provides an overall improvement to output beam quality because it can eliminate the spherical aberrations that result from using a cylindrical lens with a circular cross-section. However, the higher cost of producing shaped micro-lenses presents a potential tradeoff to the laser package designer. In the preferred embodiment illustrated in FIG. 2, micro-lens 208 is a "D" shaped lens. Micro-lens 208 has a flat front surface 209 that acts as the input surface receiving laser diode bar light emission from diode bar 202. In an alternative embodiment, the cross-sectional area of microlens 208 is circular. For example, micro-cylinder lens 208 may be an optical fiber.

Another factor that can affect the efficient coupling of output radiation from a laser diode bar is the bending of the laser diode bar. This bending is referred to as the "bow" or "smile" of the laser diode bar. See e.g., U.S. Pat. No. 5,515,391, issued May 7, 1996 to Endriz, which is incorporated by reference herein in its entirety.

The term "smile" refers to the imperfect planarity of a typical laser diode bar. Because of this imperfect planarity, the individual laser diode sources are not perfectly aligned along the array axis (some diodes are displaced up and some diodes are displaced down with respect to the array axis). This imperfect laser diode alignment makes it difficult to efficiently couple each individual laser diode source with a single cylindrical or shaped micro-lens located in proximity to the output facet of the diode array. Thus, "smile" can cause a significant portion of the output beam from laser diode bar 202 to be directed above micro-cylinder lens 208 or a significant portion of the output beam to be directed below micro-cylinder lens 208. Methods of compensating for laser bar "smile" are discussed laser in Section 3.

According to the present invention, asymmetry is reduced by mounting the laser bar 202 and micro-cylinder lens 208 in a vertical manner (approximately along the X-axis of FIG. 2 or substantially parallel to the gravity vector). In contrast, mounting laser bar 202 and micro-cylinder lens 208 in a horizontal plane (or in the Y-Z plane of FIG. 2) increases the likelihood of gravity induced optical coupling mismatches of the laser diode bar output beam and the micro-cylinder lens 208. While this mismatch may appear trivial since the components 202 and 208 are small in size (i.e., tens to hundreds of microns), we have discovered that gravity plays an important role in achieving optimum alignment, including bending of lens 208 when it is positioned in the Y-Z plane in the package. For example, even though micro-cylinder lens 208 is mounted to submount 204 (in a manner described in the '184 patent), micrometer-level sagging occurs due to the effects of gravity. This sagging is characterized by the longitudinal axis of the micro-cylinder lens 208 slightly bending. Thus, a displacement of approximately 1 $\mu$m along the longitudinal axis of micro-cylinder lens 208 when combined with the output beam displacement due to diode bar "smile" discussed above result in a less-than-optimally collimated output beam.

Because the alignment of micro-cylinder lens 208 is critical to optimally collimating the output of laser diode bar 202, even sub-micrometer bending can cause problems for effectively conserving the brightness of the individual laser diode sources for use in the far-field. This sagging can prevent the efficient co-alignment of the individual sources in diode bar 202 and/or the collimation of the individual sources. By mounting cylinder lens 208 with its cylindrical axis parallel to the gravity vector, gravity can no longer cause the slight bending of the longitudinal axis of micro-cylinder lens 208. Thus, the inherent collimation problems due to "smile" are not compounded according to the present invention.

The fast-axis collimated output emerging from micro-cylinder lens 208 propagates toward turning mirror 210. Turning mirror 210 is an important element in the laser diode package because it acts to symmeterize the etendue of laser diode bars. The "etendue" of a component, such as laser bar 202, is defined as the mathematical product of the angular extent and the spatial extent of the radiation emitted from that component. The functional operation of turning mirror 210 is taught and disclosed in the '401 patent to Endriz referenced above.

The emitted light from micro-cylinder lens 208 as the appearance of four beamlets, with each beamlet being approximately 140 μm along the direction of the laser array, and approximately 40 μm wide. Each beamlet at the point just beyond the exit surface of micro-cylinder lens 208 has an approximate divergence of 60 milli-radians (mrad) in the fast-axis. Turning mirror 210 rotates each individual beam by 90° and re-directs the beams along a new direction of propagation, e.g., in the X-axis direction of FIG. 2. After the beams are reformatted by turning mirror 210, the fast-axis divergence now takes place in the X-Z plane, and the slow-axis divergence takes place in the Y-Z plane, according to FIG. 2.

In the preferred embodiment of the present invention, turning mirror 210 is a structure having a series of reflective surfaces corresponding to the number of individual light sources in diode bar 202. For example, the reflective surfaces can be formed on a metal substrate, such as copper, that has a high thermal conductivity and is plated with gold for forming a high reflective surface. After the light emitted from laser bar 202 is initially collimated by lens 208, each beamlet encounters a set of two reflective surfaces that cause a rotational transformation of the output beam profile. See e.g., the '401 patent referenced above. These reflective surfaces can be high reflection (HR) coated to provide greater than 99 percent reflection of the beamlets.

The beamlets are directed from turning mirror 210 along a new direction of propagation towards a beam-fill optics 214. The rotationally transformed light beamlets are characterized by beam cross section profile 211. For simplicity, as previously indicated, only four individual beamlet profiles are shown. As the beamlets approach optics 214, they grow in spatial extent such that the impinge the beam-fill optics at a given distance (approximately 5 mm) away from the diode laser output. At this point, the beamlets have now grown to approximately 300 μm in the fast direction and in the slow-axis direction the beam has expanded to approximately 1.5 mm. The redirected light then enters optics 214, which further collimates the fast-axis of the emitted beamlets. Beam-fill optics 214 include a series of refractive lenses corresponding to the number of beamlets exiting the turning mirror 210. According to the present invention, beam fill element 214 may be an optical element comprising a series of lenslet arrays. The light emerging from beam fill optics 214 will have the appearance of coming from a single virtual source having a brightness output approximating the light from all of the individual laser diode sources of bar 202.

Beam-fill optics 214 is placed at a distance equivalent to its focal length from the diode laser output and is mounted to a mounting block (not shown) that is preferably a low thermal expansion material. A material with a low thermal expansion coefficient can help reduce misalignment due to thermal variations inside laser package 200. The beam exiting beam-fill optics 214 exhibits a beam profile that is shown in beam cross section profile 215.

Laser package 200 also includes a macro-cylinder lens 216 to further collect and collimate the output of diode bar 202. In particular, macro-cylinder lens 216 acts to collimate the slow-axis (lateral) divergence of the output beamlets exiting beam fill optics 214. As shown in beam cross section profile 217, the beamlet pattern has a preferred rectangular profile suitable for focussing in the far field.

Laser package 200 may further include a final aspheric/spherical lens 218 to collapse the series of beamlets into a tightly focussed spot in the far-field, if a collimated beam output is not desired for an application. For example, as shown in FIG. 2, the far field application shown is focussing into an optical fiber 220. Fiber 220 can be a multimode or single mode optical fiber, depending on the far field application. Lens 218 can be a conventional spherical optic, or it can be an aspheric lens that focusses all the light rays corresponding to the collimated and reformatted output beam in the same spot. An aspheric lens 218 helps to avoid problems associated with spherical aberrations.

FIG. 3 is a schematic diagram of turning mirror 210. As mentioned above, turning mirror 210 performs a rotational transformation of the light beams emitted from laser bar 202. This rotation transposes the lateral and transverse cross sectional dimensions of each beamlet. In the preferred embodiment of the present invention, turning mirror 210 is a structure comprising a series of polished, coated, reflective surfaces, whereby two reflective surfaces are machined on a copper structure for each individual laser source comprising diode bar 202. Other types of metal and non-metal structures can be used to fabricate turning mirror 210, depending on such factors as surface reflectivity and thermal conductivity. The surfaces of mirror 210 are coated with highly reflective material, such as gold.

Turning mirror 210 includes an array of contiguous "V"-shaped micro-grooves formed along a front surface 308 of the turning mirror. The grooves are formed along and extend into the edge formed between corner points 316 and 317 (i.e., the edge created by joinder of surfaces 308 and 311). A coordinate axis system is also provided in FIG. 3 to help identify the specific orientation of each reflective surface. The micro-grooves of turning mirror 210 are rotated with respect to the "groove" axis (the (1,1,1) vector) by 30°. The result is that the first reflective surface 310 is oriented in the (1,−1,0) plane, and the second reflective surface 312 is oriented in the (1,0,−1) plane. This results in a strong asymmetry in the length of the shortest segment from the "groove valley" to the 2 different "peaks" nearest to it on each side. In addition, ridges created by the grooving of the material do not interfere with the optical path of the diode beam. The preferred turning mirror provides a large entrance aperture to capture a substantial portion (greater than 95 percent) of the collimated beamlets emerging from micro-cylinder lens 208.

FIG. 4 illustrates the laser diode package as part of a housing unit 400. For simplicity, only laser diode bar 202, micro-cylinder lens 208, and turning mirror 210 are shown. According to the present invention, both the laser bar axis of diode bar 202 and the cylinder axis of micro-cylinder lens 208 are oriented substantially parallel to the X-axis, which is the direction of the gravity vector. In addition, housing unit 400 can be used as a support for the turning mirror 210, as well as an additional heat sink for the heat generated from diode bar 202.

FIG. 5 illustrates a bottom-side exploded-view of an alternative embodiment of the present invention. A high power laser diode bar 502, similar to laser diode bar 202 from FIG. 2, emits laser radiation comprising a number of individual beams. A micro-cylinder lens 508, similar to micro-cylinder lens 208, collimates the fast-axis divergence of the emitted laser beamlets. This collimation takes place in the Y-Z plane of FIG. 5. Similar to FIG. 2, the laser diode array axis and the cylinder axis of lens 208 are both oriented parallel to the X-axis of FIG. 5, which corresponds to the direction of the gravity vector.

According to this embodiment of the present invention, a collimating lens array 509 receives the light emerging from micro-cylinder lens 508. Lens array 509 collimates the slow-axis divergence of the laser beam (in the X-Y plane) from laser diode bar 502. For example, lens array 509 includes a series cylinder lens corresponding to the number of individual diode sources in laser diode bar 502. In addition, each of cylinder lenses comprising lens array 509 has a focal length corresponding to the slow-axis divergence of the individual sources of diode bar 502.

After slow-axis collimation is performed by lens array 509, the beam propagates toward a turning mirror 510, similar to turning mirror 210 from FIG. 2. As described above, turning mirror 510 reformats the beam by performing a 90° spatial rotation of each beamlet and redirecting the beamlets along a new direction of propagation. As shown in FIG. 5, the new direction of propagation is along the Z-axis.

A macro-cylinder lens 516, similar to macro-cylinder lens 216 from FIG. 2, having its cylinder axis parallel to the X-axis, acts to steer the reformatted beamlets into a beam-fill optical element 514. Beam-fill element 514 performs a re-collimation of the reformatted beam, similar to beam-fill element 214 from FIG. 2. Thus, in this alternative embodiment, initial collimation of both the fast-axis and slow-axis divergences takes place before the beam is reformatted by turning mirror 510. Therefore, this embodiment is particularly useful for employment with laser arrays 502 that comprises plural emitters that operate single mode.

3. Compensating Lens Sag and Laser Bar "Smile"

According to a further embodiment of the present invention, optimal coupling of the laser diode output beam is further enhanced by vertically orienting the micro-cylinder lens in addition to compensating for laser bar "smile". As mentioned above, an inherent defect in laser diode bar operation is caused by the bending of the laser diode bar. This bending is due to the difference in the coefficient of thermal expansion of the laser bar and its underlying submount, so that at higher operating temperatures, the laser bar will "blow" due to this thermal expansion difference. As a result, light emission from individual diode laser sources are slightly displaced from the array axis, particularly emitters in the center of the array. This bending, however, can be compensated for as follows.

For example, one method of compensating for this laser diode bar "smile" is to use a laser diode that further includes a plurality of thermal load elements as well as a plurality of individual diode sources. See e.g., the '391 patent referenced above. Thermal load elements are similar to the individual laser diode sources, except that their outputs are blocked. Each thermal load element is placed in direct contact with a corresponding individual diode laser source. This direct contact allows for efficient heat transfer. By applying a variable bias current to each thermal load, the operating temperature of the individual laser diode source can be adjusted. For example, if laser bar "smile" exists in a specific region of the laser diode bar, a first current can be delivered to a first thermal load element, and a second current can be delivered to an adjacent thermal load element. As a result, the individual diode sources coupled to the first and second load elements are adjusted in position with respect to the gravity vector.

It is well known that altering the temperature of a laser diode source changes the wavelength of the output radiation emitted from that source. In addition, charges in operating temperature of the laser diode source can cause the laser diode source to shift in position with respect to the array axis. Thus, by adjusting the bias current applied to each thermal load element, one-to-two micron adjustments can be made in the planarity of the laser diode bar. In addition to compensating for displaced optical coupling lenses, such as a micro-cylinder lens that sags, this adjustment can compensate for the inherent "smile" of the laser diode bar. A conventional power supply provides the direct current (d.c.) bias current delivered to the thermal load elements.

The present invention can also be utilized with other means of compensating for laser diode bar "smile," such as staggering the laser diode emitters. See e.g., U.S. Pat. No. 5,517,328, issued May 14, 1996 to Wilson (incorporated by reference herein in its entirety). In this embodiment of the present invention, two or more individual laser diode sources in a region of the diode bar are offset relative to one another and with respect to the array axis, such that their output beams partially overlap. By altering the output intensity of one emitter with respect to the other, a desired overall intensity level can be maintained for the output intensity originating in that region of the diode bar. In this embodiment, laser bar "smile" can be compensated for by respectively varying the current applied to each of the offset sources. In turn, the output intensity of the offset sources is varied such that the far field beam profile is adjusted to have a uniform intensity distribution across the entire bar output beam pattern.

4. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for efficient collimation of an aligned multiple beam output coupled from a diode laser bar to a lens system to conserve source brightness and output uniformity, comprising the steps of:

orienting the laser diode bar having multiple beam outputs substantially in straight-line alignment in a manner that its longitudinal length is aligned along a direction substantially parallel to a gravity vector; and orienting the lens system in a manner that its longitudinal axis is aligned along a direction substantially parallel to the gravity vector so that both the laser diode bar and the lens system are prevented from sagging as in the case where its longitudinal axis is aligned along a direction substantially perpendicular to the gravity vector so that substantially straight-line alignment of the lens system is maintained with the straight-line alignment of the multiple beam outputs.

2. The method of claim 1, further comprising the step of:

compensating for a bending of the laser diode bar by applying a varying bias current to a plurality of thermal load elements, wherein the laser bar comprises a plurality of laser diode sources and a plurality of thermal load elements, wherein each thermal load element is in direct contact with one of the plurality of laser diode sources, and wherein the bias current is varied corresponding to a far field intensity distribution the light output from the laser bar.

3. The method of claim 1, wherein at least two of the plurality of individual laser diode sources are offset relative to each other with respect to the longitudinal axis, further comprising the step of:

compensating for a bending of the laser diode bar by changing a current applied to a first offset source relative to the current applied to a second offset source, wherein after the change in current, a far field intensity distribution profile of the output beam is uniform.

4. A multiple light beam assembly providing for high output beam coupling efficiency through enhanced beam alignment and uniformity, comprising:

a laser diode bar having a plurality of individual laser diode sources providing multiple beam outputs substantially aligned along a longitudinal axis of said bar, said laser diode array oriented substantially parallel to a gravity vector so that the sagging of the laser diode bar is prevented providing a substantially straight-line alignment of the multiple beam outputs oriented along the gravity vector; and a lens system optically coupled to receive said straight-line alignment of the multiple beam outputs of said laser diode bar and collimate said outputs in a least one orthogonal direction, a longitudinal axis of said lens system oriented substantially parallel to the gravity vector so that the sagging of the lens system is also prevented so that substantially straight-line alignment of the lens system is maintained with the straight-line alignment of the multiple beam outputs.

5. The multiple light beam assembly of claim 4, wherein said array further comprises:

a plurality of thermal load elements coupled to said plurality of laser diode sources.

6. The multiple light beam assembly of claim 5, wherein said array further comprises:

a power source supply for providing a bias current independently to said plurality of laser diode sources and said plurality of thermal load elements.

7. The multiple light beam assembly of claim 6, wherein said bias current to either said sources or to said thermal load elements is variable.

8. The multiple light beam assembly of claim 4, wherein at least two of said plurality of individual laser diode sources are offset from each other relative to said bar longitudinal axis, an emitted intensity of each of said offset sources being altered to alter a far field intensity distribution profile of said multiple beam output to render the profile more uniform.

9. The multiple light beam assembly of claim 4, wherein said lens system comprises a lens for collimating a fast-axis divergence of said diode laser array.

10. The multiple light beam assembly of claim 9, wherein said lens system comprises a cylinder lens.

11. The multiple light beam assembly of claim 10, wherein said cylinder lens is a D-shaped cylindrical lens.

12. The multiple light beam assembly of claim 4, wherein said lens system comprises at least one lens for collimating both a fast-axis and a slow-axis divergence of said diode laser bar.

13. The multiple light beam assembly of claim 4, wherein said assembly further comprises:

a turning mirror optically coupled to receive said collimated multiple beam output from said lens system and reformat said orientation and alignment of said multiple beam output of said laser diode bar.

14. The multiple light beam assembly of claim 13, wherein said orientation is 90° rotation of individual beams comprising said multiple beam output with their re-alignment one above another.

15. The multiple light beam assembly of claim 13, wherein the assembly further comprises:

a beam-fill optics optically coupled to receive said multiple beam output from said turning mirror to provide an output having the appearance of a single virtual source comprising said multiple beam output.

16. The multiple light beam assembly of claim 15, further comprising:

a further lens optically coupled to receive the multiple beam output from said beam-fill optics and collimate said output in at least another orthogonal direction.

17. The multiple light beam assembly of claim 16, wherein said lens system collimates said multiple beam output fast-axis divergence and said further lens collimates said multiple beam output slow-axis divergence.

18. The multiple light beam assembly of claim 16, wherein said assembly further comprises:

a focusing lens optically coupled to receive said multiple beam output from said further lens to focus said output to a diffraction limited spot.

19. A multiple light beam assembly providing for high output beam coupling efficiency, comprising:

a laser diode bar having a plurality of individual laser diode sources providing multiple beam outputs substantially aligned along a longitudinal axis of said bar, said laser diode array oriented substantially parallel to a gravity vector so that the sagging of the laser diode bar is prevented providing a substantially straight-line alignment of the multiple beam outputs oriented along the gravity vector; and a lens system optically coupled to receive said aligned multiple beam output of said laser diode bar comprising multiple beam output in a first orthogonal direction and a second lens to collimate said aligned multiple beam output in a second orthogonal direction, a longitudinal axis of both of said lens oriented substantially parallel to the gravity vector so that the sagging of the lens system is also prevented so that substantially straight-line alignment of the lens system is maintained with the straight-line alignment of the multiple beam outputs; and a turning mirror optically coupled to receive the orthogonally collimated multiple beam output from said lens system and reformat the orientation of multiple beam output of said laser diode bar.

20. The multiple light beam assembly of claim 19 further comprising a beam filling optics following said turning mirror to format the individual beams into a uniform field appearing as a single beam output.

* * * * *